(12) United States Patent
Ahn et al.

(10) Patent No.: US 9,646,770 B2
(45) Date of Patent: *May 9, 2017

(54) MULTILAYER CERAMIC CAPACITOR AND MOUNTING BOARD FOR MULTILAYER CERAMIC CAPACITOR

(71) Applicant: SAMSUNG ELECTRO-MECHANICS CO., LTD., Suwon-si, Gyeonggi-do (KR)

(72) Inventors: Young Ghyu Ahn, Suwon-si (KR); Sang Soo Park, Suwon-si (KR); Min Cheol Park, Suwon-si (KR); Byoung Hwa Lee, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/042,563

(22) Filed: Feb. 12, 2016

(65) Prior Publication Data

US 2016/0163462 A1    Jun. 9, 2016

(30) Foreign Application Priority Data

Mar. 29, 2013 (KR) .................. 10-2013-0034272

(51) Int. Cl.
*H01G 4/30* (2006.01)
*H01G 2/06* (2006.01)
(Continued)

(52) U.S. Cl.
CPC .............. *H01G 4/30* (2013.01); *H01G 2/065* (2013.01); *H01G 4/005* (2013.01); *H01G 4/012* (2013.01);
(Continued)

(58) Field of Classification Search
CPC ........................................................ H01G 4/30
(Continued)

(56) References Cited

U.S. PATENT DOCUMENTS 6,370,015 B2    4/2002   Noda et al.
8,638,543 B2    1/2014   Ahn et al.
(Continued)

FOREIGN PATENT DOCUMENTS

CN    1909125 A    2/2007
CN    102548213 A   7/2012
(Continued)

OTHER PUBLICATIONS

Office Action Japanese Patent Application No. 2013-088212 dated Dec. 3, 2013 with English translation.
(Continued)

*Primary Examiner* — Eric Thomas
(74) *Attorney, Agent, or Firm* — McDermott Will & Emery LLP

(57) ABSTRACT

There is provided multilayer ceramic capacitor including, a ceramic body including a plurality of dielectric layers laminated therein, an active layer including a plurality of first and second internal electrodes alternately exposed through both end surfaces of the ceramic body, with the dielectric layers interposed therebetween, and having capacitance formed therein, an upper cover layer formed on an upper portion of the active layer, a lower cover layer formed on a lower portion of the active layer and having a thickness greater than that of the upper cover layer, first and second dummy electrode terminals provided in the lower cover layer to be alternately exposed through both end surfaces of the lower cover layer, and first and second external electrodes covering the both end surfaces of the ceramic body.

14 Claims, 6 Drawing Sheets

(51) Int. Cl.
*H01G 4/012* (2006.01)
*H01G 4/232* (2006.01)
*H01G 4/005* (2006.01)
*H01G 4/12* (2006.01)
*H01G 4/224* (2006.01)
*H01G 4/248* (2006.01)
*H05K 1/11* (2006.01)
*H05K 1/18* (2006.01)

(52) U.S. Cl.
CPC ............... *H01G 4/12* (2013.01); *H01G 4/224* (2013.01); *H01G 4/232* (2013.01); *H01G 4/248* (2013.01); *H05K 1/111* (2013.01); *H05K 1/181* (2013.01); *H05K 2201/10015* (2013.01)

(58) Field of Classification Search
USPC .............................................. 361/301.4, 303
See application file for complete search history.

(56) References Cited

U.S. PATENT DOCUMENTS

| | | |
|---|---|---|
| 2007/0025054 A1 | 2/2007 | Tonogai et al. |
| 2012/0152604 A1 | 6/2012 | Ahn et al. |
| 2012/0262837 A1 | 10/2012 | Hoshi et al. |
| 2012/0300361 A1 | 11/2012 | Togashi |
| 2013/0321981 A1* | 12/2013 | Ahn .................. H01G 4/30 361/321.2 |

FOREIGN PATENT DOCUMENTS

| | | |
|---|---|---|
| JP | 06-215978 A | 8/1994 |
| JP | 8-130160 A | 5/1996 |
| JP | 2001-015384 A | 1/2001 |
| JP | 2004-193352 A | 7/2004 |
| JP | 2012-216864 A | 11/2012 |
| JP | 2012-222276 A | 11/2012 |
| JP | 2012-248581 A | 12/2012 |

OTHER PUBLICATIONS

Examination Report dated Jul. 17, 2014 issued in the corresponding Taiwanese Patent Application No. 102114148.
Chinese Office Action issued in Application No. 201310187505.9 dated Jun. 24, 2016, with English translation.

* cited by examiner

MULTILAYER CERAMIC CAPACITOR AND MOUNTING BOARD FOR MULTILAYER CERAMIC CAPACITOR

CROSS-REFERENCE TO RELATED APPLICATIONS

This application is a continuation of U.S. patent application Ser. No. 13/866,786, filed Apr. 19, 2013, which claims priority of Korean Patent Application No. 10-2013-0034272 filed on Mar. 29, 2013, the disclosures of which are incorporated herein by reference.

BACKGROUND OF THE INVENTION

Field of the Invention

The present invention relates to a multilayer ceramic capacitor and a mounting board for a multilayer ceramic capacitor.

Description of the Related Art

A multilayer ceramic capacitor, a multilayer chip electronic component, is a chip type capacitor commonly mounted on printed circuit boards of various electronic products, such as image display devices including a liquid crystal display (LCD), a plasma display panel (PDP) and the like, computers, personal digital assistants (PDAs), mobile phones, and the like, and serving to charge or discharge electricity.

Multilayer ceramic capacitors (MLCCs) may be used as components of various electronic products due to having the advantages of a small size, high capacitance, and ease of mounting.

Multilayer ceramic capacitors may have a structure in which a plurality of dielectric layers are stacked and internal electrodes having different polarities are alternately interposed therebetween.

Since these dielectric layers have piezoelectricity properties and electrostrictive properties, a piezoelectric phenomenon may occur and thus cause vibrations between the internal electrodes when AC or DC voltage is applied to the multilayer ceramic capacitor.

Such vibrations may be transferred to a printed circuit board having the multilayer ceramic capacitor mounted thereon through external electrodes of the multilayer ceramic capacitor, such that the overall printed circuit board becomes an acoustic reflective surface to generate a vibratory sound regarded as noise.

The vibratory sound may correspond to an audible frequency in a region of 20 to 20,000 Hz, which may cause listener discomfort and is referred to as acoustic noise.

In order to reduce acoustic noise, a product having a form in which a lower cover layer of the multilayer ceramic capacitor has an increased thickness has been researched.

However, when the thickness of the lower cover layer of the multilayer ceramic capacitor is increased, delamination may occur in a boundary surface between an active layer including the internal electrodes and the lower cover layer, due to a difference in a sintering shrinkage behavior.

In order to prevent the delamination, a multilayer ceramic capacitor having a structure in which dummy electrode terminals exposed in the same direction are formed in the lower cover layer has been disclosed.

However, the multilayer ceramic capacitor having dummy electrode terminals may have a defect in that a step between a region in which the internal electrodes of an active layer overlap each other and a region of longitudinal margin portions of the dummy electrode terminal thereof is increased, and thus, delamination may occur in the longitudinal margin part.

The following Patent Document 1 discloses content in which the thickness of the lower cover layer of the multilayer ceramic capacitor is increased, but does not disclose a structure in which the lower cover layer includes a dummy electrode.

RELATED ART DOCUMENT (Patent Document 1) Japanese Patent Laid-open Publication No. Hei 6-215978

SUMMARY OF THE INVENTION

An aspect of the present invention provides a method for forming a dummy electrode on a lower cover layer, capable of preventing delamination from occurring in a boundary surface between an active layer and the lower cover layer and in a longitudinal margin portion of the lower cover layer while reducing noise occurring because of vibrations due to a piezoelectric phenomenon.

According to an aspect of the present invention, there is provided a multilayer ceramic capacitor, including: a ceramic body including a plurality of dielectric layers laminated therein; an active layer including a plurality of first and second internal electrodes alternately exposed through both end surfaces of the ceramic body, with the dielectric layers interposed therebetween, and having capacitance formed therein; an upper cover layer formed on an upper portion of the active layer; a lower cover layer formed on a lower portion of the active layer and having a thickness greater than that of the upper cover layer; first and second dummy electrode terminals provided in the lower cover layer to be alternately exposed through both end surfaces of the lower cover layer; and first and second external electrodes covering the both end surfaces of the ceramic body, wherein the first and second dummy electrode terminals respectively include a plurality of first and second dummy patterns exposed through the same end surface of the lower cover layer, with the dielectric layers interposed therebetween, and when an interval between the first and second internal electrodes is defined as Ta and an interval between the first and second dummy electrode terminals is defined as Tb, Tb≥Ta is satisfied.

When half of an overall thickness of the ceramic body is denoted by A, a thickness of the lower cover layer is denoted by B, half of an overall thickness of the active layer is denoted by C, and a thickness of the upper cover layer is denoted by D, a ratio of deviation of a central portion of the active layer from a central portion of the ceramic body, (B+C)/A, may satisfy 1.063≤(B+C)/A≤1.745.

A ratio of the thickness D of the upper cover layer to the thickness B of the lower cover layer, D/B, may satisfy 0.021≤D/B≤0.422.

A ratio of the thickness B of the lower cover layer to half A of the overall thickness of the ceramic body, B/A, may satisfy 0.329≤B/A≤1.522.

A ratio of half C of the overall thickness of the active layer to the thickness B of the lower cover layer, C/B, may satisfy 0.146≤C/B≤2.458.

A point of inflection formed on the both end surfaces of the ceramic body may be formed at a height equal to or lower than that of a center of the overall thickness of the ceramic body, due to a difference between a deformation rate occurring in the central portion of the active layer and a deformation rate occurring in the lower cover layer when a voltage is applied thereto.

According to an aspect of the present invention, there is provided a mounting board for a multilayer ceramic capacitor, comprising: a printed circuit board having first and second electrode pads disposed thereon; and a multilayer ceramic capacitor mounted on the printed circuit board, wherein the multilayer ceramic capacitor includes: a ceramic body including a plurality of dielectric layers laminated therein; an active layer including a plurality of first and second internal electrodes alternately exposed through both end surfaces of the ceramic body, with the dielectric layers interposed therebetween; an upper cover layer formed on an upper portion of the active layer; a lower cover layer formed on a lower portion of the active layer and having a thickness greater than that of the upper cover layer; first and second dummy electrode terminals provided in the lower cover layer to be alternately exposed through both end surfaces of the lower cover layer; and first and second external electrodes formed from the both end surfaces of the ceramic body to upper and lower surfaces thereof to be electrically connected to exposed portions of the first and second internal electrodes and the first and second dummy electrode terminals, respectively, and to be connected to the first and second electrode pads, respectively, through a soldering, the first and second dummy electrode terminals respectively include a plurality of first and second dummy patterns exposed through the same end surface of the lower cover layer, with the dielectric layers interposed therebetween, and when an interval between the first and second internal electrodes is defined as Ta and an interval between the first and second dummy electrode terminals is defined as Tb, Tb≥Ta is satisfied.

In the multilayer ceramic capacitor, when half of an overall thickness of the ceramic body is denoted by A, a thickness of the lower cover layer is denoted by B, half of an overall thickness of the active layer is denoted by C, and a thickness of the upper cover layer is denoted by D, a ratio of deviation of a central portion of the active layer from a central portion of the ceramic body, (B+C)/A, may satisfy 1.063≤(B+C)/A≤1.745.

In the multilayer ceramic capacitor, a ratio of the thickness D of the upper cover layer to the thickness B of the lower cover layer, D/B, may satisfy 0.021≤D/B≤0.422.

In the multilayer ceramic capacitor, a ratio of the thickness B of the lower cover layer to half A of the overall thickness of the ceramic body, B/A, may satisfy 0.329≤B/A≤1.522.

In the multilayer ceramic capacitor, a ratio of half C of the overall thickness of the active layer to the thickness B of the lower cover layer, C/B, may satisfy 0.146≤C/B≤2.458.

In the multilayer ceramic capacitor, a point of inflection formed on the both end surfaces of the ceramic body may be formed at a height equal to or lower than that of the soldering, due to a difference between a deformation rate occurring in the central portion of the active layer and a deformation rate occurring in the lower cover layer when a voltage is applied thereto.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
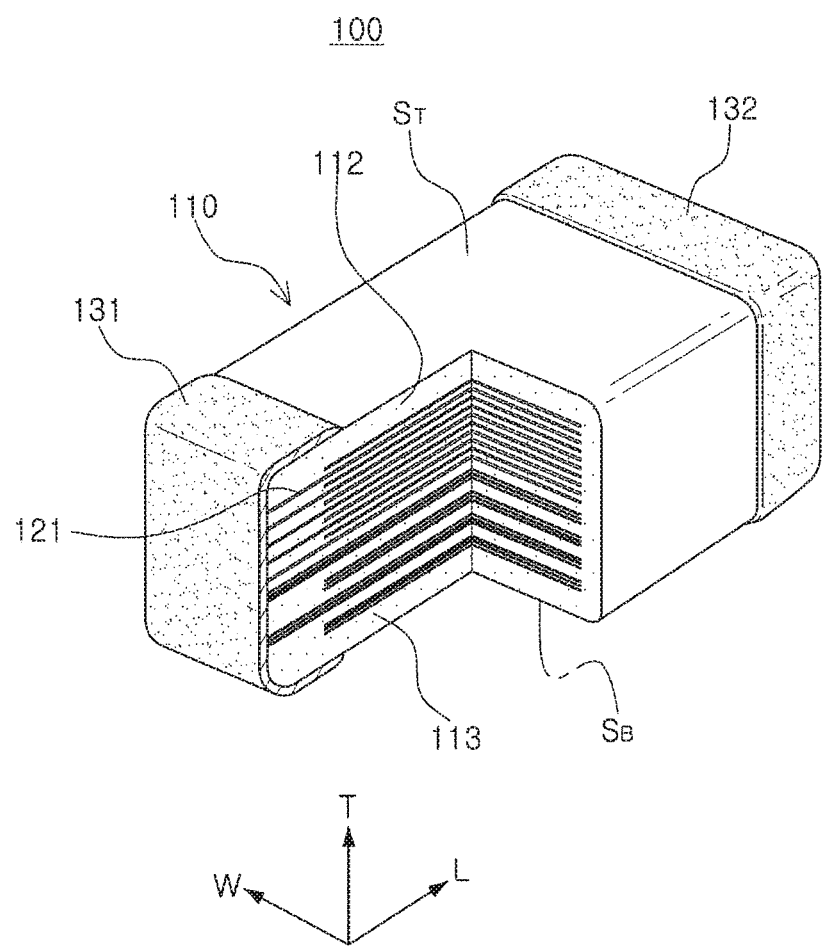
FIG. 1 is a perspective view schematically showing a multilayer ceramic capacitor according to an embodiment of the present invention of which a portion thereof is cut.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

When directions of a hexahedron are defined in order to clearly describe embodiments of the present invention, L, W, and T shown in the drawings indicate length, width, and thickness directions, respectively. Here, the width direction may also refer to a lamination direction in which dielectric layers are laminated.

In addition, in the embodiments of the present invention, for convenience of explanation, surfaces of a ceramic body on which first and second external electrodes are formed in a length direction of a ceramic body are defined as both end surfaces, and surfaces of the ceramic body perpendicular to the end surfaces are defined as side surfaces.

Multilayer Ceramic Capacitor

Figure 2:
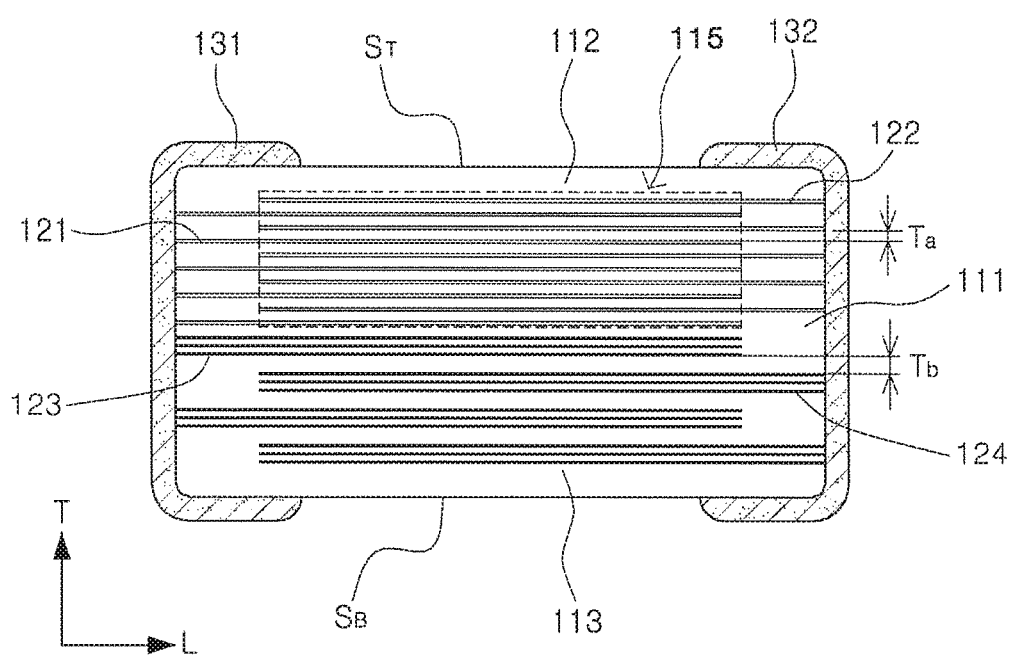
FIG. 2 is a cross-sectional view showing the multilayer ceramic capacitor of FIG. 1, cut in a length direction thereof.

FIG. 1 is a perspective view schematically showing a multilayer ceramic capacitor according to an embodiment of the present invention of which a portion thereof is cut. FIG. 2 is a cross-sectional view showing the multilayer ceramic capacitor of FIG. 1, cut in a length direction thereof.

Referring to FIGS. 1 and 2, a multilayer ceramic capacitor 100 according to an embodiment of the present invention may include a ceramic body 110, an active layer 115 including first and second internal electrodes 121 and 122, upper and lower cover layers 112 and 113, first and second external electrodes 131 and 132 formed to cover both end surfaces of the ceramic body 110, respectively, and first and second dummy electrode terminals included in the lower cover layer 113.

The ceramic body 110 is formed by laminating a plurality of dielectric layers 111 and performing sintering thereon, and shapes and dimensions of the ceramic body 110 and the number of laminations of the dielectric layers 111 are not limited to those illustrated in the present embodiment.

The plurality of dielectric layers 111 forming the ceramic body 110 are in a sintered state, and boundaries between adjacent dielectric layers 111 may be integrated such that they may not be readily discernible without a scanning electron microscope (SEM).

The ceramic body 110 may include the active layer 115 contributing to capacitance formation of the multilayer ceramic capacitor and the upper and lower cover layers 112 and 113 formed above and below the active layer 115 as upper and lower margin parts, respectively.

The active layer 115 may be formed by repeatedly laminating the plurality of first and second internal electrodes 121 and 122 with the dielectric layers 111 interposed therebetween.

Here, a thickness of the dielectric layer 111 may be optionally changed according to desired capacitance of the multilayer ceramic capacitor 100, and the thickness of a single dielectric layer may be 0.01 to 1.00 μm after sintering, but the present invention is not limited thereto.

In addition, the dielectric layer 111 may contain a ceramic powder having high dielectric permittivity, for example, a barium titanate ($BaTiO_3$) based powder or a strontium titanate ($SrTiO_3$) based powder, but the present invention is not limited thereto.

The upper and lower cover layers 112 and 113 may have the same material and constitution as the dielectric layers 111, except that they do not include the internal electrodes.

The upper and lower cover layers 112 and 113 may be formed by laminating a single dielectric layer or two or more dielectric layers on upper and lower surfaces of the active layer 115 in the thickness direction, respectively. The upper and lower cover layers 112 and 113 may basically serve to prevent damages to the first and second internal electrodes 121 and 122 due to physical or chemical stress.

The first and second internal electrodes 121 and 122 are electrodes having opposite polarities and may be formed by printing a predetermined thickness of conductive paste containing a conductive metal on the dielectric layers 111. Here, the first and second internal electrodes 121 and 122 may be alternately exposed to both end surfaces of the ceramic body 110 and may be electrically insulated from each other by the dielectric layers 111 disposed therebetween.

The first and second internal electrodes 121 and 122 may be electrically connected to the first and second external electrodes 131 and 132 through portions thereof alternately exposed to both end surfaces of the ceramic body 110.

Therefore, when voltages are applied to the first and second external electrodes 131 and 132, charges are stored between the first and second internal electrodes 121 and 122 opposite to each other. Here, the capacitance of the multilayer ceramic capacitor 100 is proportional to an area of an overlap portion of the first and second internal electrodes 121 and 122 in the active layer 115.

The thickness of the first and second internal electrodes 121 and 122 may be determined depending on use thereof, and for example, may be determined within a range of 0.2 to 1.0 μm in consideration of the size of the ceramic body 110. However, the present invention is not limited thereto.

In addition, a conductive metal contained in the conductive paste for forming the first and second internal electrodes 121 and 122 may be nickel (Ni), copper (Cu), palladium (Pd), or an alloy thereof, but the present invention is not limited thereto.

In addition, the conductive paste may be printed by a screen printing method, a gravure printing method, or the like, but the present invention is not limited thereto.

The first and second external electrodes 131 and 132 may be formed of a conductive paste containing a conductive metal. The conductive metal contained in the conductive paste may be nickel (Ni), copper (Cu), palladium (Pd), gold (Au), or an alloy thereof, but the present invention is not limited thereto.

Meanwhile, the lower cover layer 113 may be formed to have a thickness greater than that of the upper cover layer 112 by increasing the number of laminations of the dielectric layers, as compared to that of the upper cover layer 112.

In this case, as the thickness of the lower cover layer 113 increases, delamination may occur in a boundary surface between the active layer 115 and the lower cover layer 113 due to a difference in a sintering shrinkage behavior.

According to the present embodiment, a plurality of the first and second dummy electrode terminals may be provided in the lower cover layer 113 to be alternately exposed through both end surfaces of the lower cover layer 113, having the dielectric layers therebetween.

Further, the present embodiment illustrates the case in which two first dummy electrode terminals and two second dummy electrode terminals are repeatedly formed to correspond to each other in the thickness direction, but the present invention is not limited thereto. Accordingly, the first and second dummy electrode terminals may be formed such that a pair of the first and second dummy electrode terminals correspond to each other if necessary, or three or more first dummy electrode terminals and three or more second dummy electrode terminals may be repeatedly formed to correspond to each other in the thickness direction if necessary, the present invention is not limited thereto.

According to the configuration of the multilayer ceramic capacitor 100 according to the embodiment of the present invention, the occurrence of delamination in the boundary surface between the active layer 115 and the lower cover layer 113 due to a difference in a sintering shrinkage behavior therebetween may be prevented.

In this case, the first and second dummy electrode terminals may respectively include at least two first and second dummy patterns 123 and 124 exposed through end surfaces of the lower cover layer 113 in the same direction.

The first and second dummy patterns 123 and 124 may be formed by printing the same conductive paste as that used in the first and second internal electrodes 121 and 122 on the dielectric layer 111 forming the lower cover layer 113 to have a predetermined thickness and may be electrically insulated from each other by the dielectric layer 111 interposed therebetween. However, the first and second dummy patterns 123 and 124 have a different configuration from the first and second internal electrodes 121 and 122 in that at least two dummy patterns adjacent to each other in a vertical direction are exposed in the same direction.

The present embodiment illustrates the case in which the first and second dummy electrode terminals respectively include three first dummy patterns 123 and three second dummy patterns 124 exposed in the same direction, but the present invention is not limited thereto. Two or four or more first or second dummy patterns 123 or 124 may be stacked to be adjacent to each other on a single first or second dummy electrode terminal, if necessary, and therefore be exposed in the same direction.

According to the configuration of the multilayer ceramic capacitor 100, a step between the active layer 115 and a longitudinal margin portion of the lower cover layer 113 may be reduced and therefore, the occurrence of delamination in longitudinal margin portions of the first and second dummy patterns 123 and 124 may be prevented.

Further, the occurrence of delamination of the longitudinal margin portion of the lower cover layer 113 may be more effectively prevented when an interval Ta between the first and second internal electrodes 121 and 122 is equal to or smaller than an interval between the first and second dummy electrode terminals. As such, when the interval between the first and second internal electrodes 121 and 122 and the interval between the first and second dummy electrode terminals are limited, a reduction in reliability of the multilayer ceramic capacitor 100 may be prevented.

Hereinafter, a relationship between dimensions of elements included in the multilayer ceramic capacitor according to the present embodiment and acoustic noise will be described.

Figure 3:
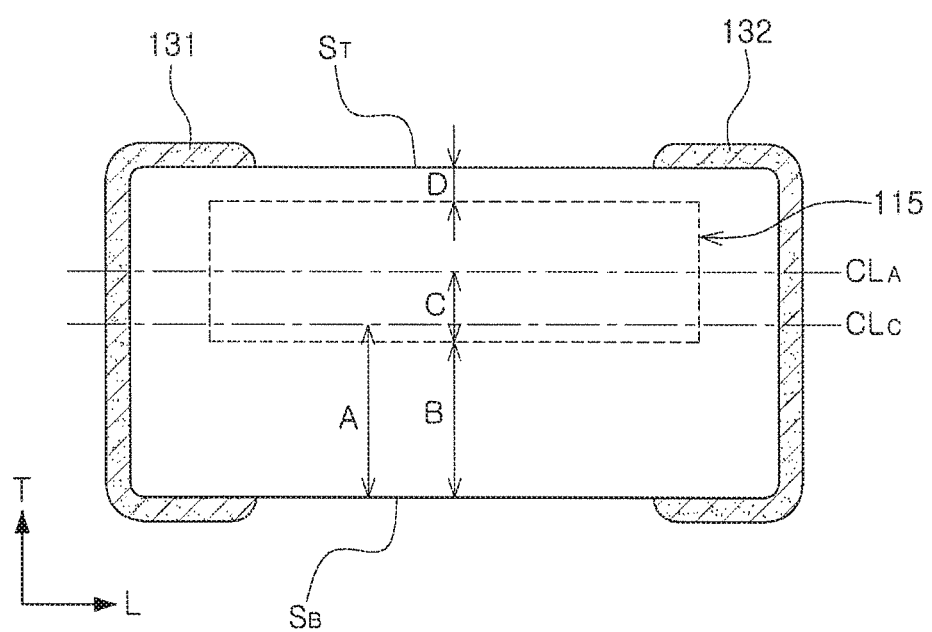
FIG. 3 is a cross-sectional view schematically showing the multilayer ceramic capacitor of FIG. 1, cut in the length direction thereof, to illustrate dimensional relationships among elements included in the multilayer ceramic capacitor.

Referring to FIG. 3, A denotes half of an overall thickness of the ceramic body 110, B denotes a thickness of the lower cover layer 113, C denotes half of an overall thickness of the active layer 115, and D denotes a thickness of the upper cover layer 112.

Here, the overall thickness of the ceramic body 110 refers to a distance from a top surface $S_T$ to a bottom surface $S_B$ of the ceramic body 110. The overall thickness of the active layer 115 refers to a distance from an upper surface of the second internal electrode 122 located at the uppermost portion of the active layer 115 to a lower surface of the first internal electrode 121 located at the lowermost portion of the active layer 115.

In addition, the thickness B of the lower cover layer 113 refers to a distance from the lower surface of the first internal electrode 121 located at the lowermost portion of the active layer 115 in the thickness direction to the bottom surface $S_B$ of the ceramic body 110, and the thickness D of the upper cover layer 112 refers to a distance from upper surface of the second internal electrode 122 located at the uppermost portion of the active layer 115 in the thickness direction to the top surface $S_T$ of the ceramic body 110.

When voltages having opposite polarities are applied to the first and second external electrodes 131 and 132 formed on both end surfaces of the multilayer ceramic capacitor 100, the ceramic body 110 expands and contracts in the thickness direction thereof due to an inverse piezoelectric effect occurring in the dielectric layers 111, and both end surfaces of the ceramic body 110 contract and expand, contrary to expansion and contraction in the thickness direction of the ceramic body 110, due to the Poisson effect.

Herein, a central portion of the active layer 115 refers to maximally expanded portions of the first and second external electrodes 131 and 132 in the length direction, and when the portion is bonded to a solder, the greater part of contraction and expansion behaviors in both ends of the ceramic body 100 in the length direction thereof may be transferred to a printed circuit board through the solder, such that the occurrence of acoustic noise may be largely increased. That is, in the present embodiment of the invention, in order to reduce acoustic noise, a point of inflection (PI) formed on both end surfaces of the ceramic body 110 may be formed at a height equal to or lower than that of a central portion $CL_C$ of the ceramic body in the thickness direction 110, due to a difference between a deformation rate occurring in a central portion $CL_A$ of the active layer 115 and a deformation rate occurring in the lower cover layer 113 when the voltages are applied thereto.

Here, in order to further reduce acoustic noise, a ratio of deviation of the central portion $CL_A$ of the active layer 115 from the central portion $CL_C$ of the ceramic body 110, (B+C)/A, may satisfy $1.063 \le (B+C)/A \le 1.745$.

Further, a ratio of thickness D of the upper cover layer 112 to thickness B of the lower cover layer 113, D/B, may satisfy $0.021 \le D/B \le 0.422$.

Further, a ratio of thickness B of the lower cover layer 113 to half A of the overall thickness of the ceramic body 110, B/A, may satisfy $0.329 \le B/A \le 1.522$.

In addition, a ratio of half C of the overall thickness of the active layer 115 to thickness B of the lower cover layer 113, C/B, may satisfy $0.146 \le C/B \le 2.458$.

Experimental Example

Individual multilayer ceramic capacitors according to inventive and comparative examples were manufactured as follows.

A slurry including a barium titanate ($BaTiO_3$) powder or the like was coated on carrier films and dried, to prepare a plurality of ceramic green sheets having a thickness of 1.8 µm.

Next, a conductive paste for an internal electrode formed of nickel was coated on the ceramic green sheets by using a screen printing method, to form the first and second internal electrodes 121 and 122, alternately exposed to both end surfaces of the ceramic green sheets opposite to each other.

The ceramic green sheets were laminated in an amount of about 370 layers to form a laminate, and the ceramic green sheets on which the first and second internal electrodes 121 and 122 are not formed were further stacked on a lower portion of the ceramic green sheets provided with the first and second internal electrodes 121 and 122, rather than being stacked on the upper portion thereof.

In this case, at least two first and second dummy patterns 123 and 124 were formed to be exposed in the same direction on the ceramic green sheets formed on the lower portion of the ceramic green sheets provided with the first and second internal electrodes 121 and 122 by a formation method the same as that used in forming the first and second internal electrodes 121 and 122, such that the first and second dummy electrode terminals are formed to be alternately exposed through both end surfaces of the ceramic green sheets.

In addition, the laminate was subjected to isostatic pressing at 85° C. under 1000 kgf/cm².

Then, the pressed laminate was cut into individual chips. Each of the cut chips was subjected to debindering at 230° C. in an atmospheric atmosphere for about 60 hours.

Thereafter, the resultant chip was sintered at 1200° C. in a reduction atmosphere under an oxygen partial pressure of $10^{-11}$ atm to $10^{-10}$ atm, lower than an equilibrium oxygen partial pressure of Ni/NiO, such that the first and second internal electrodes 121 and 122 and the first and second dummy patterns 123 and 124 were not oxidized, thereby preparing the ceramic body 110.

After being sintered, the size of the ceramic body 110 was defined as a length×width (L×W) of about 1.64 mm×0.88 mm (L×W, 1608 size). Next, the multilayer ceramic capacitor 100 was manufactured by a process of forming the first and second external electrodes 131 and 132 on both end surfaces of the ceramic body 110, respectively.

Here, a manufacturing tolerance was set within a range of ±0.1 mm in length×width (L×W), and when the manufacturing tolerance was satisfied, acoustic noise was measured.

TABLE 1

| Sample | A (μm) | B (μm) | C (μm) | D (μm) | (B + C)/A | B/A | D/B | C/B | AN (dB) | Capacitance Implementation Ratio |
|---|---|---|---|---|---|---|---|---|---|---|
| 1* | 405.5 | 40.2 | 365.4 | 39.9 | 1.000 | 0.099 | 0.993 | 9.090 | 29.5 | OK |
| 2* | 436.0 | 70.4 | 365.9 | 69.7 | 1.001 | 0.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.605 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16* | 431.7 | 94.8 | 364.3 | 40.0 | 1.063 | 0.220 | 0.422 | 3.843 | 19.9 | OK |
| 17* | 443.0 | 103.8 | 389.1 | 4.0 | 1.113 | 0.234 | 0.039 | 3.749 | 19.3 | OK |
| 18* | 443.7 | 119.8 | 363.2 | 41.1 | 1.089 | 0.270 | 0.343 | 3.032 | 18.7 | OK |
| 19* | 447.1 | 147.3 | 362.1 | 22.7 | 1.139 | 0.329 | 0.154 | 2.458 | 17.9 | OK |
| 20* | 452.8 | 164.7 | 360.2 | 20.4 | 1.159 | 0.364 | 0.124 | 2.187 | 17.3 | OK |
| 21* | 448.7 | 170.3 | 361.0 | 5.1 | 1.184 | 0.380 | 0.030 | 2.120 | 17.2 | OK |
| 22* | 470.7 | 170.4 | 365.4 | 40.2 | 1.138 | 0.362 | 0.236 | 2.144 | 17.4 | OK |
| 23* | 491.9 | 220.3 | 360.8 | 41.8 | 1.181 | 0.448 | 0.190 | 1.638 | 16.9 | OK |
| 24* | 500.6 | 270.2 | 360.5 | 9.9 | 1.260 | 0.540 | 0.037 | 1.334 | 16.8 | OK |
| 25* | 516.9 | 270.4 | 361.8 | 39.7 | 1.223 | 0.523 | 0.147 | 1.338 | 16.7 | OK |
| 26* | 502.1 | 364.9 | 312.3 | 14.7 | 1.349 | 0.727 | 0.040 | 0.856 | 16.6 | OK |
| 27* | 407.5 | 421.8 | 189.1 | 14.9 | 1.499 | 1.035 | 0.035 | 0.448 | 16.6 | OK |
| 28* | 445.8 | 493.3 | 179.3 | 39.7 | 1.509 | 1.107 | 0.080 | 0.363 | 16.5 | OK |
| 29* | 483.7 | 632.0 | 160.1 | 15.2 | 1.638 | 1.307 | 0.024 | 0.253 | 16.4 | OK |
| 30* | 520.0 | 643.4 | 190.7 | 15.2 | 1.604 | 1.237 | 0.024 | 0.296 | 16.4 | OK |
| 31* | 486.4 | 685.3 | 121.1 | 45.3 | 1.658 | 1.409 | 0.066 | 0.177 | 16.4 | OK |
| 32* | 507.2 | 742.7 | 120.8 | 30.1 | 1.702 | 1.464 | 0.041 | 0.163 | 16.4 | OK |
| 33* | 515.2 | 773.9 | 118.2 | 20.1 | 1.732 | 1.502 | 0.026 | 0.153 | 16.4 | OK |
| 34* | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.3 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

*Comparative Example,
AN: acoustic noise

Table 1 shows dimensional data of respective parts, which were measured based on an image obtained by scanning a cross-section of the ceramic body 110 in the length-thickness (L-T) directions cut in a central portion of the ceramic body 110 of the multilayer ceramic capacitor 100 in the width (W) direction thereof, using a scanning electron microscope (SEM), as shown in FIG. 3.

Here, as described above, A was defined as half of the overall thickness of the ceramic body 110, B was defined as the thickness of the lower cover layer 113, C was defined as half of the overall thickness of the active layer 115, and D was defined as the thickness of the upper cover layer 112.

In order to measure acoustic noise, one sample (multilayer ceramic capacitor) per one substrate for acoustic noise measurement was mounted on a printed circuit board while being classified vertically, and then the printed circuit board was mounted on a measuring jig.

In addition, DC voltage and voltage variation were applied to both terminals of the sample mounted on the measuring jig by using a DC power supply and a function generator. The acoustic noise was measured through a microphone installed directly above the printed circuit board.

In Table 1 above, samples 1 to 3 were comparative examples having a symmetrical cover structure in which the thickness B of the lower cover layer 113 was approximately similar to the thickness D of the upper cover layer 112, and samples 4 to 13 were comparative examples having a structure in which the thickness D of the upper cover layer 112 (D) was greater than the thickness B of the lower cover layer 113 (B).

Further, samples 14, 15, and 35 to 37 were comparative examples having a structure in which the thickness B of the lower cover layer 113 was greater than the thickness D of the upper cover layer 112, and Samples 16 to 34 were inventive examples according to the present invention.

Here, in the case in which (B+C)/A was approximately 1, it can be appreciated that the central portion of the active layer 115 did not significantly deviate from the central portion of the ceramic body 110. In the samples 1 to 3 having the symmetrical cover structure in which the thickness B of the lower cover layer 113 was approximately similar to the thickness D of the upper cover layer 112, (B+C)/A was approximately 1.

In the case in which (B+C)/A was greater than 1, it can be appreciated that the central portion of the active layer 115 deviated from the central portion of the ceramic body 110 upwardly. Here, in the case in which (B+C)/A was smaller than 1, it can be appreciated that the central portion of the active region 115 deviated from the central portion of the ceramic body 110 downwardly.

Referring to the above Table 1, it may be confirmed that in samples 16 to 34, inventive examples in which the ratio of deviation of the central portion of the active layer 115 from the central portion of the ceramic body 110, (B+C)/A, satisfied 1.063≤(B+C)/A≤1.745, acoustic noise was remarkably reduced to be less than 20 dB.

In addition, samples 1 to 15 in which the ratio of deviation of the central portion of the active layer 115 from the central portion of the ceramic body 110, (B+C)/A was less than 1.063, the central portion of the active region 115 rarely deviated from the central portion of the ceramic body 110 or the central portion of the active region 115 deviated from the central portion of the ceramic body 110 downwardly.

The samples 1 to 15, in which the (B+C)/A was less than 1.063 have acoustic noise of 25 to 32.5 dB, it can be appreciated that there is no reduction effect of acoustic noise, as compared to the inventive examples according to the present invention.

Further, in the case of samples 35 to 37 in which the ratio of deviation of the central portion of the active layer 115 from the central portion of the ceramic body 110, (B+C)/A, was greater than 1.745, capacitance was excessively lowered as compared with target capacitance, causing defects in capacitance.

Meanwhile, among the samples of the examples, in samples 19 to 34 that are Examples in which the ratio B/A of the thickness B of the lower cover layer 113 to the thickness A of the ceramic body 110 and the ratio C/B of the thickens C of the active layer 115 to the thickness B of the lower cover layer 113 each satisfy the range of 0.329≤B/A≤1.522 and 0.146≤C/B≤2.458, it can be appreciated that acoustic noise was reduced to a level less than 18 dB.

On the other hand, in samples 35 to 37 in which the ratio of the thickness B of the lower cover layer 113 to half A of the overall thickness of the ceramic body 110, B/A, was greater than 1.522 or the ratio of half C of the overall thickness of the active layer 115 to the thickness B of the lower cover layer 113, C/B, was less than 0.146, the actual capacitance to the target capacitance was low, resulting in defects in capacitance.

The following Table 2 shows whether the first and second dummy electrode terminals are applied to the lower cover layer 113 and whether delamination occurs according to the number of the first or second dummy patterns 123 or 124 provided in the same direction in the first and second dummy electrode

TABLE 2

| Sample | Whether dummy electrodes in the same detection are alternately applied | The number of dummy electrode terminals in the same direction | The number of dummy electrodes in the dummy electrode terminal in the same direction | Total number of dummy electrodes | A | B | C | D | (B + C)/A | B/A | D/B | C/B | Acoustic Noise (dB) | Delamination occurence rate |
|---|---|---|---|---|---|---|---|---|---|---|---|---|---|---|
| 1* | x | — | — | — | 509.5 | 250.1 | 364.4 | 40.0 | 1.206 | 0.491 | 0.160 | 1.457 | 16.9 | 3% |
| 2* | ○ | 1 | 60 | 80 | 508.7 | 249.8 | 363.9 | 39.7 | 1.207 | 0.491 | 0.159 | 1.457 | 16.8 | 12% |
| 3 | ○ | 2 | 40 | 80 | 511.3 | 254.0 | 364.1 | 40.4 | 1.209 | 0.497 | 0.159 | 1.433 | 16.9 | 0% |
| 4 | ○ | 3 | 28 | 78 | 512.5 | 254.4 | 365.2 | 40.2 | 1.209 | 0.496 | 0.158 | 1.436 | 17.0 | 0% |
| 5 | ○ | 5 | 15 | 75 | 511.3 | 254.8 | 364.0 | 39.8 | 1.210 | 0.498 | 0.156 | 1.429 | 16.8 | 0% |
| 6 | ○ | 7 | 10 | 70 | 510.5 | 251.1 | 364.9 | 40.1 | 1.207 | 0.492 | 0.160 | 1.453 | 17.0 | 0% |
| 7 | ○ | 12 | 5 | 60 | 508.6 | 247.5 | 364.8 | 40.0 | 1.204 | 0.487 | 0.162 | 1.474 | 17.1 | 0% |
| 8 | ○ | 22 | 2 | 44 | 511.4 | 252.6 | 365.0 | 40.2 | 1.208 | 0.494 | 0.159 | 1.445 | 17.2 | 0% |

In Table 1 above, in the case in which a capacitance implementation rate (that is, a ratio of actual capacitance to target capacitance) is denoted by "NG", it means that an actual capacitance value was below 80% when a target capacitance value was 100%.

Further, in inventive examples in which the ratio of the thickness D of the upper cover layer 112 to the thickness B of the lower cover layer 113, D/B, satisfied 0.021≤D/B≤0.422, acoustic noise was remarkably reduced.

On the other hand, in comparative examples in which the ratio of the thickness D of the upper cover layer 112 to the thickness B of the lower cover layer 113, D/B, was greater than 0.422, it can be appreciated that there was no effect of reducing acoustic noise.

In the case in which the ratio of the thickness D of the upper cover layer 112 to the thickness B of the lower cover layer 113, D/B, was less than 0.021, the thickness B of the lower cover layer 113 was excessively large as compared with the thickness D of the upper cover layer 112, and thus cracks or delamination may occur and the ratio of the actual capacitance to the targeted capacitance was low, such that capacitance deficiencies may occur.

Here, as described above, A was defined as half of the overall thickness of the ceramic body 110, B was defined as the thickness of the lower cover layer 113, C was defined as half of the overall thickness of the active layer 115, and D was defined as the thickness of the upper cover layer 112.

In Table 2, sample 1 shows a comparative example in which the dummy pattern was not formed on the lower cover layer 113. In the case of the sample 1, relationships among numerical values of A through D of the multilayer ceramic capacitor were within the preferred ranges of the present embodiment, and therefore the reduction effect of acoustic noise was achieved, but delamination occurred in the boundary surface between the active layer 115 and the lower cover layer 113.

Sample 2 shows a comparative example having a structure in which the dummy pattern was formed on the lower cover layer 113 but all the dummy pattern terminals were exposed to only one end surface of the lower cover layer 113 in the same direction. In the case of sample 2, relationships among numerical values of A through D of the multilayer ceramic capacitor were within the preferred ranges of the present embodiment, and therefore the reduction effect of the acoustic noise was achieved, but a step between the active layer 115 and the longitudinal margin portion in a direction opposite to a direction in which the dummy pattern is exposed is increased, such that delamination occurred in the longitudinal margin portion of the dummy pattern.

In samples 3 to 8, inventive examples, the first and second dummy electrode terminals were formed on the lower cover layer 113, the first and second dummy electrode terminals were alternately exposed through both end surfaces of the lower cover layer 113, the first and second dummy electrode terminals respectively included at least two first and second dummy patterns 123 and 124 exposed to one end surface of the lower cover layer 113 in the same direction, and in the case of the structure, it can be appreciated that delamination did not occur in the longitudinal margin portion of the ceramic body 110.

Therefore, in order to prevent delamination from occurring in the boundary surface between the active layer 115 and the lower cover layer 113 and in the longitudinal margin portion of the lower cover layer 113, it can be appreciated that the structure in which the first and second dummy electrode terminals alternately exposed through both end surfaces of the lower cover layer 113 are formed in the lower cover layer 113, and the first and second dummy electrode terminals include a plurality of first and second dummy patterns 123 and 124, respectively, exposed in the same direction may be preferable.

Mounting Board for Multilayer Ceramic Capacitor

Figure 4:
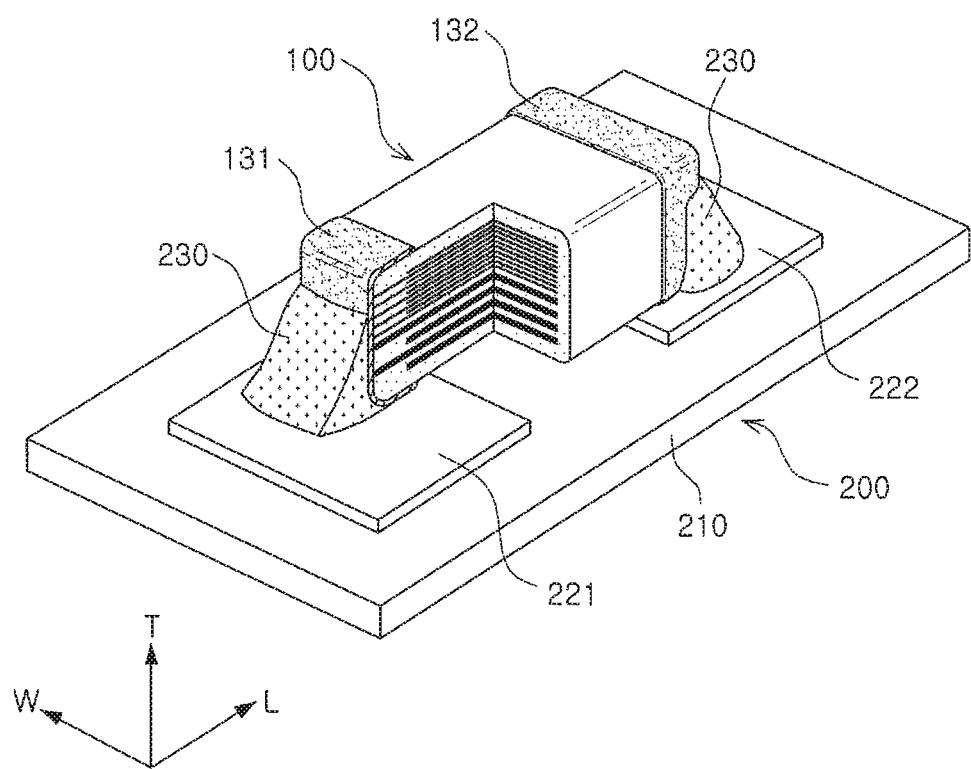
FIG. 4 is a perspective view showing a state in which the multilayer ceramic capacitor of FIG. 1 is mounted on a printed circuit board.
Figure 5:
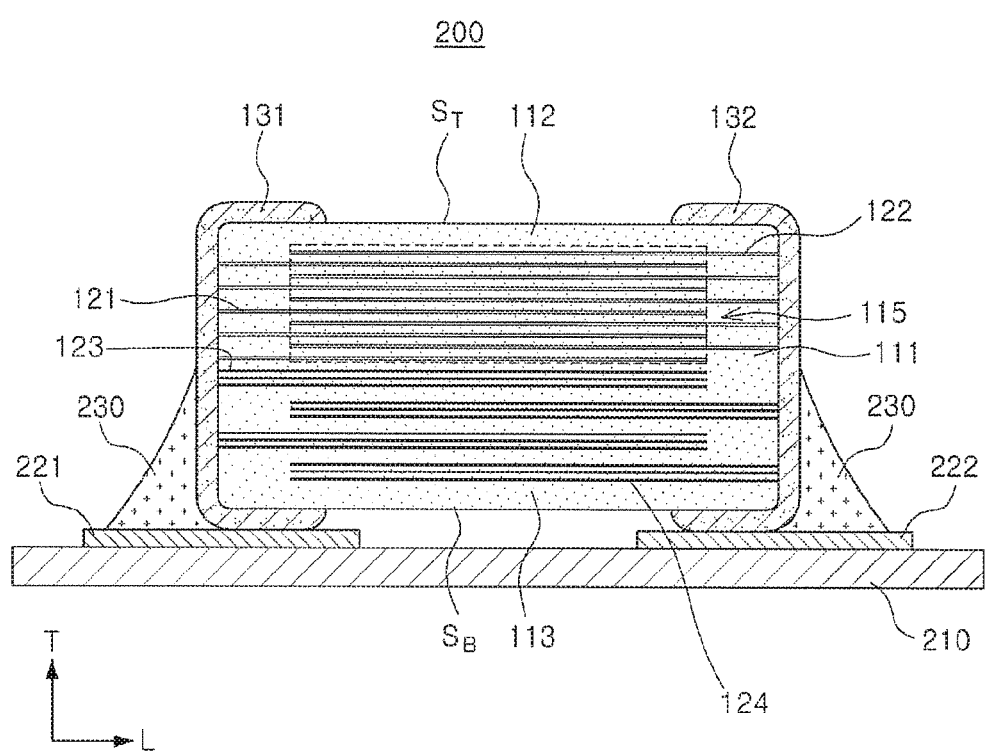
FIG. 5 is a cross-sectional view showing the multilayer ceramic capacitor and the printed circuit board of FIG. 4, cut in the length direction thereof.

Referring to FIGS. 4 and 5, a mounting board 200 for the multilayer ceramic capacitor 100 according to the present embodiment may include a printed circuit board 210 on which the multilayer ceramic capacitor 100 is horizontally mounted; and first and second electrode pads 221 and 222 spaced apart from each other on an upper surface of the printed circuit board 210.

In this case, the multilayer ceramic capacitor 100 may be electrically connected to the printed circuit board 210 by soldering 230 while the lower cover layer 113 is disposed to form a lower portion of the multilayer ceramic capacitor 100 and the first and second external electrodes 131 and 132 are positioned on and in contact with the first and second electrode pads 221 and 222, respectively.

When voltages are applied in the state in which the multilayer ceramic capacitor 100 is mounted on the printed circuit board 210 as described above, acoustic noise may be generated.

In this case, the amount of soldering 230 required to connect the first and second external electrodes 131 and 132 of the multilayer ceramic capacitor 100 to the first and second electrode pads 221 and 222 may be determined according to the size of the first and second electrode pads 221 and 222. In addition, the level of acoustic noise may be controlled according to the amount of soldering 230.

Figure 6:
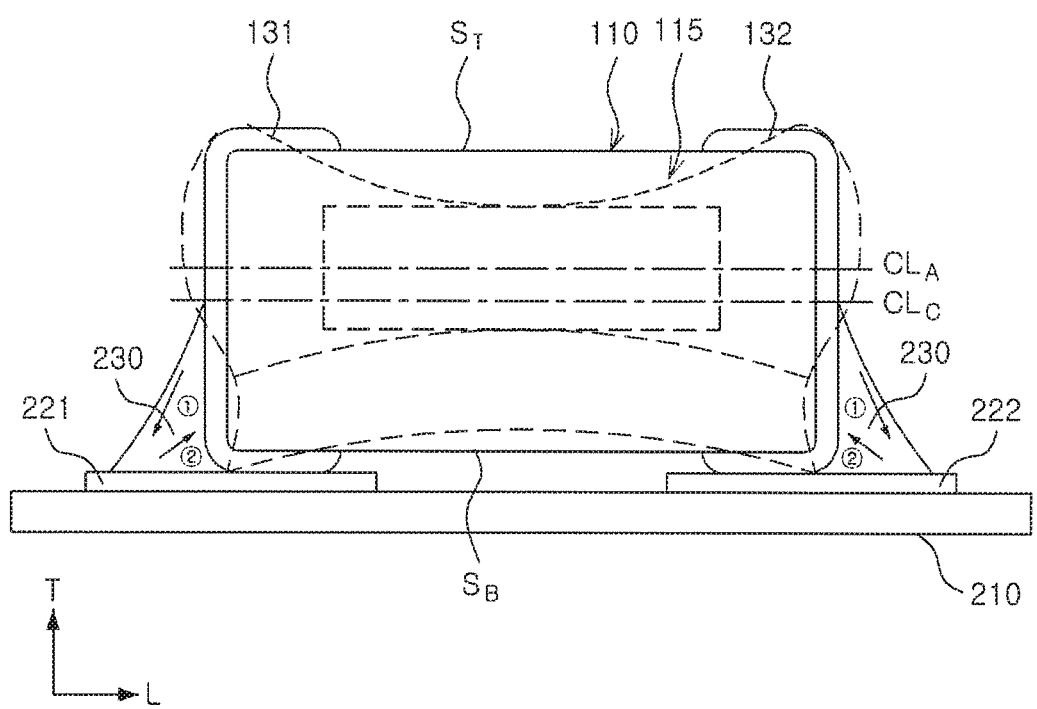
FIG. 6 is a cross-sectional view schematically showing deformation of the multilayer ceramic capacitor of FIG. 4 when a voltage is applied thereto in a state in which the multilayer ceramic capacitor is mounted on the printed circuit board.

Referring to FIG. 6, when voltages having opposite polarities are applied to the first and second external electrodes 131 and 132 formed on both end surfaces of the multilayer ceramic capacitor 100 in the state in which the multilayer ceramic capacitor 100 is mounted on the printed circuit board 210, the ceramic body 110 expands and contracts in the thickness direction thereof due to an inverse piezoelectric effect occurring in the dielectric layers 111, and both end portions of the first and second external electrodes 131 and 132 contract and expand, contrary to expansion and contraction in the thickness direction of the ceramic body 110, due to the Poisson effect.

Here, the central portion of the active layer 115 refers to maximally expanded portions of the first and second external electrodes 131 and 132 in the length direction, and when the portion is bonded to the solder, the greater part of contraction and expansion behaviors in both ends of the ceramic body 100 in the length direction thereof may be transferred to a printed circuit board through the solder, such that the occurrence of acoustic noise may be largely increased.

When both end surfaces of the multilayer ceramic capacitor 100 in the length direction are maximally expanded, outward expansive force ① is generated in an upper portion of the solder 230 by expansion and the lower cover layer 113 is bent upwardly due to the contraction of the active layer 115, such that lower portions of both end surfaces of the multilayer ceramic capacitor 100 in the length direction are contracted and accordingly, a lower portion of the soldering 230 connected to the portions may also have contractive force (②) applied thereto.

Therefore, in the present embodiment, when a point of inflection formed on both end surfaces of the ceramic body 110 is formed at a height equal to or lower than that of the soldering 230, due to a difference between a deformation rate occurring in the central portion $CL_A$ of the active region 115 and a deformation rate occurring in the lower margin part 113 when the voltages are applied thereto, acoustic noise may be further reduced.

As set forth above, according to the embodiment of the present invention, the lower cover layer can have a thickness greater than that of the upper cover layer to reduce vibrations occurring in the multilayer ceramic capacitor, thereby reducing acoustic noise transferred to and occurring in the printed circuit board.

Further, the first and second dummy electrode terminals can be formed in the lower cover layer to be alternately exposed through both end surfaces of the lower cover layer to prevent delamination from occurring in the boundary surface between the active layer and the lower cover layer.

Further, the first and second dummy electrode terminals can respectively include the plurality of first and second dummy electrodes exposed in the same direction, and the interval between the first and second internal electrodes can be equal to or smaller than that of the first and second dummy electrode terminals to prevent delamination from occurring in the longitudinal margin portion formed on the lower cover layer.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor, comprising:
  a ceramic body including a plurality of dielectric layers laminated therein;
  an active layer including a plurality of first and second internal electrodes alternately exposed through both end surfaces of the ceramic body, with the dielectric layers interposed therebetween, and having capacitance formed therein;
  an upper cover layer formed on an upper portion of the active layer;
  a lower cover layer formed on a lower portion of the active layer and having a thickness greater than that of the upper cover layer;
  first and second dummy electrode terminals provided in the lower cover layer to be alternately exposed through both end surfaces of the lower cover layer; and first and second external electrodes covering the both end surfaces of the ceramic body, wherein the first and second dummy electrode terminals respectively include a plurality of first and second dummy patterns exposed through the same end surface of the lower cover layer, with the dielectric layers interposed therebetween, and when an interval between the first and second internal electrodes is defined as Ta and an interval between the first and second dummy electrode terminals is defined as Tb, Tb≥Ta is satisfied.

2. The multilayer ceramic capacitor of claim 1, wherein when half of an overall thickness of the ceramic body is denoted by A, a thickness of the lower cover layer is denoted by B, half of an overall thickness of the active layer is denoted by C, and a thickness of the upper cover layer is denoted by D, a ratio of deviation of a central portion of the active layer from a central portion of the ceramic body, $(B+C)/A$, satisfies $1.063 \leq (B+C)/A \leq 1.745$.

3. The multilayer ceramic capacitor of claim 1, wherein a ratio of the thickness D of the upper cover layer to the thickness B of the lower cover layer, D/B, satisfies $0.021 \leq D/B \leq 0.422$.

4. The multilayer ceramic capacitor of claim 1, wherein a ratio of the thickness B of the lower cover layer to half A of the overall thickness of the ceramic body, B/A, satisfies $0.329 \leq B/A \leq 1.522$.

5. The multilayer ceramic capacitor of claim 1, wherein a ratio of half C of the overall thickness of the active layer to the thickness B of the lower cover layer, C/B, satisfies $0.146 \leq C/B \leq 2.458$.

6. The multilayer ceramic capacitor of claim 1, wherein a point of inflection formed on the both end surfaces of the ceramic body is formed at a height equal to or lower than that of a center of the overall thickness of the ceramic body, due to a difference between a deformation rate occurring in the central portion of the active layer and a deformation rate occurring in the lower cover layer when a voltage is applied thereto.

7. The multilayer ceramic capacitor of claim 1, wherein the upper cover layer is devoid of dummy electrode terminals.

8. A mounting board for a multilayer ceramic capacitor, comprising:
a printed circuit board having first and second electrode pads disposed thereon; and
a multilayer ceramic capacitor mounted on the printed circuit board,
wherein the multilayer ceramic capacitor includes: a ceramic body including a plurality of dielectric layers laminated therein; an active layer including a plurality of first and second internal electrodes alternately exposed through both end surfaces of the ceramic body, with the dielectric layers interposed therebetween; an upper cover layer formed on an upper portion of the active layer; a lower cover layer formed on a lower portion of the active layer and having a thickness greater than that of the upper cover layer; first and second dummy electrode terminals provided in the lower cover layer to be alternately exposed through both end surfaces of the lower cover layer; and first and second external electrodes formed from the both end surfaces of the ceramic body to upper and lower surfaces thereof to be electrically connected to exposed portions of the first and second internal electrodes and the first and second dummy electrode terminals, respectively, and to be connected to the first and second electrode pads, respectively, through a soldering, the first and second dummy electrode terminals respectively include a plurality of first and second dummy patterns exposed through the same end surface of the lower cover layer, with the dielectric layers interposed therebetween, and when an interval between the first and second internal electrodes is defined as Ta and an interval between the first and second dummy electrode terminals is defined as Tb, Tb≥Ta is satisfied.

9. The mounting board for a multilayer ceramic capacitor of claim 8, wherein in the multilayer ceramic capacitor, when half of an overall thickness of the ceramic body is denoted by A, a thickness of the lower cover layer is denoted by B, half of an overall thickness of the active layer is denoted by C, and a thickness of the upper cover layer is denoted by D, a ratio of deviation of a central portion of the active layer from a central portion of the ceramic body, $(B+C)/A$, satisfies $1.063 \leq (B+C)/A \leq 1.745$.

10. The mounting board for a multilayer ceramic capacitor of claim 8, wherein in the multilayer ceramic capacitor, a ratio of the thickness D of the upper cover layer to the thickness B of the lower cover layer, D/B, satisfies $0.021 \leq D/B \leq 0.422$.

11. The mounting board for a multilayer ceramic capacitor of claim 8, wherein in the multilayer ceramic capacitor, a ratio of the thickness B of the lower cover layer to half A of the overall thickness of the ceramic body, B/A, satisfies $0.329 \leq B/A \leq 1.522$.

12. The mounting board for a multilayer ceramic capacitor of claim 8, wherein in the multilayer ceramic capacitor, a ratio of half C of the overall thickness of the active layer to the thickness B of the lower cover layer, C/B, satisfies $0.146 \leq C/B \leq 2.458$.

13. The mounting board for a multilayer ceramic capacitor of claim 8, wherein in the multilayer ceramic capacitor, a point of inflection formed on the both end surfaces of the ceramic body is formed at a height equal to or lower than that of the soldering, due to a difference between a deformation rate occurring in the central portion of the active layer and a deformation rate occurring in the lower cover layer when a voltage is applied thereto.

14. The mounting board for a multilayer ceramic capacitor of claim 8, wherein the upper cover layer is devoid of dummy electrode terminals.

* * * * *